(12) United States Patent  
Bangsaruntip et al.

(10) Patent No.: US 9,035,383 B2  
(45) Date of Patent: May 19, 2015

(54) NANOWIRE CAPACITOR FOR BIDIRECTIONAL OPERATION

(71) Applicant: International Business Machines Corporation, Armonk, NY (US)

(72) Inventors: Sarunya Bangsaruntip, Mount Kisco, NY (US); Amlan Majumdar, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/967,807

(22) Filed: Aug. 15, 2013

(65) Prior Publication Data

US 2014/0209864 A1    Jul. 31, 2014

Related U.S. Application Data

(63) Continuation of application No. 13/751,490, filed on Jan. 28, 2013.

(51) Int. Cl.  
*H01L 29/06* (2006.01)  
*H01L 49/02* (2006.01)  
(Continued)

(52) U.S. Cl.  
CPC ............... *H01L 21/77* (2013.01); *B82Y 40/00* (2013.01); *H01L 29/0669* (2013.01);  
(Continued)

(58) Field of Classification Search  
CPC ...... B82Y 10/00; B82Y 40/00; H01L 21/845; H01L 21/823431; H01L 21/823821; H01L 27/0924; H01L 27/1085; H01L 27/10873; H01L 27/12; H01L 27/1211; H01L 28/60; H01L 29/0665; H01L 29/66795; H01L 29/785; H01L 28/40; H01L 27/0629; Y10S 977/762  
USPC .......................... 257/347, 532; 438/479, 155  
See application file for complete search history.

(56) References Cited

U.S. PATENT DOCUMENTS 6,110,821 A    8/2000    Kohara et al.  
6,124,639 A    9/2000    Domenicucci et al.  
(Continued)

FOREIGN PATENT DOCUMENTS

EP    1724785 A1    11/2006

OTHER PUBLICATIONS

Rock-Hyun Baek et al., "C-V Characteristics in Undoped Gate-All-Around Nanowire FET Array", Feb. 2011, Electron Device Letters, IEEE, vol. 32 No. 2, pp. 116-118.*

(Continued)

*Primary Examiner* — Khiem D Nguyen  
*Assistant Examiner* — Pauline Vu  
(74) *Attorney, Agent, or Firm* — Louis J. Percello; Michael J. Chang, LLC

(57) ABSTRACT

A method of fabricating an electronic device includes the following steps. At least one first set and at least one second set of nanowires and pads are etched in an SOI layer of an SOI wafer. A first gate stack is formed that surrounds at least a portion of each of the first set of nanowires that serves as a channel region of a capacitor device. A second gate stack is formed that surrounds at least a portion of each of the second set of nanowires that serves as a channel region of a FET device. Source and drain regions of the FET device are selectively doped. A first silicide is formed on the source and drain regions of the capacitor device that extends at least to an edge of the first gate stack. A second silicide is formed on the source and drain regions of the FET device.

7 Claims, 10 Drawing Sheets

(51) Int. Cl.
    *H01L 21/84* (2006.01)
    *H01L 27/12* (2006.01)
    *H01L 21/77* (2006.01)
    *B82Y 40/00* (2011.01)
    *H01L 27/06* (2006.01)

(52) U.S. Cl.
    CPC ......... *Y10S 977/762* (2013.01); *H01L 27/0629* (2013.01); *H01L 28/40* (2013.01); *H01L 21/84* (2013.01); *H01L 27/1203* (2013.01)

(56) References Cited

U.S. PATENT DOCUMENTS

| | | | |
|---|---|---|---|
| 6,387,803 B2 | 5/2002 | Talwar et al. | |
| 7,659,164 B1 | 2/2010 | Yoo | |
| 7,667,296 B2 | 2/2010 | Stumbo et al. | |
| 7,691,720 B2 | 4/2010 | Furukawa et al. | |
| 7,875,920 B2 | 1/2011 | Choi et al. | |
| 7,884,004 B2 | 2/2011 | Bangsaruntip et al. | |
| 7,939,404 B2 | 5/2011 | Jang | |
| 8,309,445 B2 | 11/2012 | Chang et al. | |
| 2002/0048919 A1* | 4/2002 | Iwamatsu et al. | 438/592 |
| 2003/0162359 A1* | 8/2003 | Yang et al. | 438/300 |
| 2003/0193058 A1* | 10/2003 | Fried et al. | 257/200 |
| 2005/0146036 A1 | 7/2005 | Huang | |
| 2007/0117311 A1* | 5/2007 | Zaman | 438/253 |
| 2007/0126044 A1* | 6/2007 | Shioya et al. | 257/306 |
| 2008/0006883 A1* | 1/2008 | Mori | 257/379 |
| 2008/0268635 A1 | 10/2008 | Yu et al. | |
| 2010/0065809 A1 | 3/2010 | Lee et al. | |
| 2010/0276761 A1* | 11/2010 | Tung et al. | 257/384 |
| 2011/0108900 A1 | 5/2011 | Chang et al. | |
| 2011/0254054 A1* | 10/2011 | Itou | 257/192 |
| 2011/0278544 A1* | 11/2011 | Bangsaruntip et al. | 257/24 |
| 2011/0298025 A1* | 12/2011 | Haensch et al. | 257/296 |
| 2011/0309333 A1* | 12/2011 | Cheng et al. | 257/24 |
| 2012/0164800 A1 | 6/2012 | Ikeda | 438/151 |
| 2012/0187375 A1* | 7/2012 | Guo et al. | 257/24 |
| 2012/0256242 A1* | 10/2012 | Chang et al. | 257/296 |

OTHER PUBLICATIONS

Jibin Zou et al., "Predictive 3-D Modeling of Parasitic Gate Capacitance in Gate-all-Around Cylindrical Silicon Nanowire MOSFETs", Oct. 2011, IEEE Transactions on Electron Devices, vol. 58 No. 10, pp. 3379-3387.*

S. Bangsaruntip et al., "Gate-all-around Silicon Nanowire 25-Stage CMOS Ring Oscillators with Diameter Down to 3 nm," 2010 symposium on VLSI Technology (VLSIT), pp. 21-22 (Aug. 23, 2010).

S. Bangsaruntip et al., "High Performance and Highly Uniform Gate-All-Around Silicon Nanowire MOSFETs with Wire Size Dependent Scaling," 2009 IEEE International Electron Devices Meeting (IEDM) IEDM09-297, pp. 1-4 (Dec. 7-9, 2009).

* cited by examiner

NANOWIRE CAPACITOR FOR BIDIRECTIONAL OPERATION

CROSS-REFERENCE TO RELATED APPLICATION(S)

This application is a continuation of U.S. application Ser. No. 13/751,490 filed on Jan. 28, 2013, the disclosure of which is incorporated by reference herein.

FIELD OF THE INVENTION

The present invention relates to capacitors in non-planar device structures and more particularly, to techniques for forming bi-directional capacitors in a gate-all-around nanowire integration flow.

BACKGROUND OF THE INVENTION

Non-field effect transistor (FET) elements, such as capacitors and diodes are important elements in complementary metal-oxide semiconductor (CMOS) technology. Capacitors, for instance, are used to store energy in an electrical field. Capacitors are also used for power decoupling in analogue circuits. Decoupling capacitors serve to reduce noise caused by one or more of the circuit elements.

Much research has been done regarding planar capacitor device structures. See, for example, U.S. Patent Application Publication Number 2011/0108900 A1 filed by Chang et al., entitled "Bi-Directional Self-Aligned FET Capacitor." The formation of capacitors in non-planar, fully depleted devices, however still remains a challenge in the industry.

Therefore, techniques for fabricating capacitors in a non-planar integration process flow would be desirable.

SUMMARY OF THE INVENTION

The present invention provides techniques for forming bi-directional capacitors in a gate-all-around nanowire integration flow. In one aspect of the invention, a method of fabricating an electronic device is provided. The method includes the following steps. A SOI wafer is provided having an SOI layer over a BOX. At least one first set of nanowires and first set pads are etched in the SOI layer and at least one second set of nanowires and second set of pads are etched in the SOI layer, wherein the first set of pads are attached at opposite ends of the first set of nanowires in a ladder-like configuration and wherein the second set of pads are attached at opposite ends of the second set of nanowires in a ladder-like configuration. A first gate stack is formed that surrounds at least a portion of each of the first set of nanowires that serves as a channel region of a capacitor device, wherein portions of the first set of nanowires extending out from the gate stack and the first set of pads serve as source and drain regions of the capacitor device. A second gate stack is formed that surrounds at least a portion of each of the second set of nanowires that serves as a channel region of a field effect transistor (FET) device, wherein portions of the second set of nanowires extending out form the gate stack and the second set of pads serve as source and drain regions of the FET device. The source and drain regions of the FET device are selectively doped. A first silicide is formed on the source and drain regions of the capacitor device that extends at least to an edge of the first gate stack. A second silicide is formed on the source and drain regions of the FET device.

In another aspect of the invention, another method of fabricating an electronic device is provided. The method includes the following steps. An SOI wafer is provided having an SOI layer over a BOX. At least one first set of nanowires and first set pads are etched in the SOI layer and at least one second set of nanowires and second set of pads are etched in the SOI layer, wherein the first set of pads are attached at opposite ends of the first set of nanowires in a ladder-like configuration and wherein the second set of pads are attached at opposite ends of the second set of nanowires in a ladder-like configuration. A first gate stack is formed that surrounds at least a portion of each of the first set of nanowires that serves as a channel region of a capacitor device, wherein portions of the first set of nanowires extending out from the gate stack and the first set of pads serve as source and drain regions of the capacitor device. A second gate stack is formed that surrounds at least a portion of each of the second set of nanowires that serves as a channel region of a field effect transistor (FET) device, wherein portions of the second set of nanowires extending out form the gate stack and the second set of pads serve as source and drain regions of the FET device. The source and drain regions of the FET device and the source and drain regions of the capacitor device are doped. A first silicide is formed on the source and drain regions of the capacitor device that extends into the channel region of the capacitor device which is undoped. A second silicide is formed on the source and drain regions of the FET device.

In yet another aspect of the invention, an electronic device is provided. The electronic device includes at least one first set of nanowires and first set pads etched in an SOI layer of an SOI wafer and at least one second set of nanowires and second set of pads etched in the SOI layer, wherein the first set of pads are attached at opposite ends of the first set of nanowires in a ladder-like configuration and wherein the second set of pads are attached at opposite ends of the second set of nanowires in a ladder-like configuration; a first gate stack that surrounds at least a portion of each of the first set of nanowires that serves as a channel region of a capacitor device, wherein portions of the first set of nanowires extending out from the gate stack and the first set of pads serve as source and drain regions of the capacitor device, wherein the source and drain regions of the capacitor device are undoped; a second gate stack that surrounds at least a portion of each of the second set of nanowires that serves as a channel region of a FET device, wherein portions of the second set of nanowires extending out form the gate stack and the second set of pads serve as source and drain regions of the FET device, wherein the source and drain regions of the FET device are doped; a first silicide formed on the source and drain regions of the capacitor device that extends at least to an edge of the first gate stack; and a second silicide formed on the source and drain regions of the FET device.

In still yet another aspect of the invention, another electronic device is provided. The electronic device includes at least one first set of nanowires and first set pads in a SOI layer of an SOI wafer and at least one second set of nanowires and second set of pads etched in the SOI layer, wherein the first set of pads are attached at opposite ends of the first set of nanowires in a ladder-like configuration and wherein the second set of pads are attached at opposite ends of the second set of nanowires in a ladder-like configuration; a first gate stack that surrounds at least a portion of each of the first set of nanowires that serves as a channel region of a capacitor device, wherein portions of the first set of nanowires extending out from the gate stack and the first set of pads serve as source and drain regions of the capacitor device, wherein the source and drain regions of the capacitor device are doped; a second gate stack that surrounds at least a portion of each of the second set of nanowires that serves as a channel region of a FET device, wherein portions of the second set of nanowires extending out form the gate stack and the second set of pads serve as source and drain regions of the FET device, wherein the source and drain regions of the FET device are doped; a first silicide on the source and drain regions of the capacitor device that extends into the channel region of the capacitor device which is undoped; and a second silicide on the source and drain regions of the FET device.

A more complete understanding of the present invention, as well as further features and advantages of the present invention, will be obtained by reference to the following detailed description and drawings.

DETAILED DESCRIPTION OF PREFERRED EMBODIMENTS

Figure 1A:
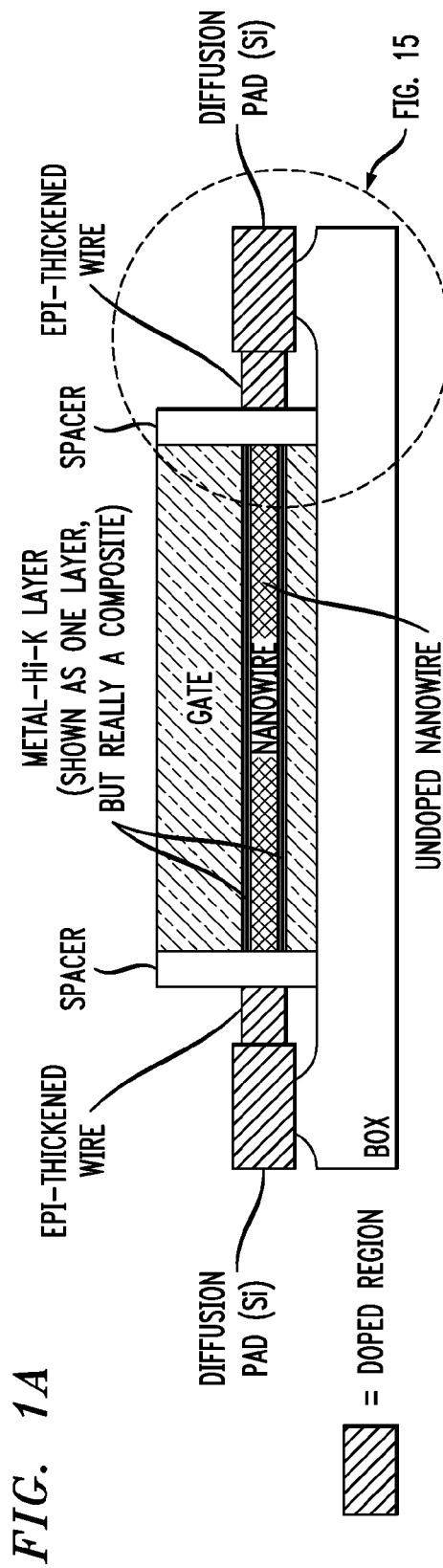
FIG. 1A is a cross-sectional diagram of a gate-all-around nanowire capacitor device having doped source and drain regions according to an embodiment of the present invention.

Provided herein are techniques for forming bi-directional capacitor devices in a gate-all-around nanowire process flow. First, an overview of the present techniques is provided by way of reference to FIG. 1A and FIG. 1B. According to an exemplary embodiment of the present techniques, bi-directional capacitor devices are formed having one of two exemplary (non-limiting) configurations. In a first configuration, which is shown in FIG. 1A, the bi-directional capacitor devices have doped source and drain regions and an undoped channel region. In order to get bi-directional operation in this doped source and drain configuration, according to the present techniques, a contact metal (in this case a silicide which will serve as source and drain electrodes of the device, see below) is intentionally permitted to extend past a junction between the doped and undoped regions of the device, which permits the formation of a Schottky junction between the contact metal and the undoped portions of the device.

Figure 1B:
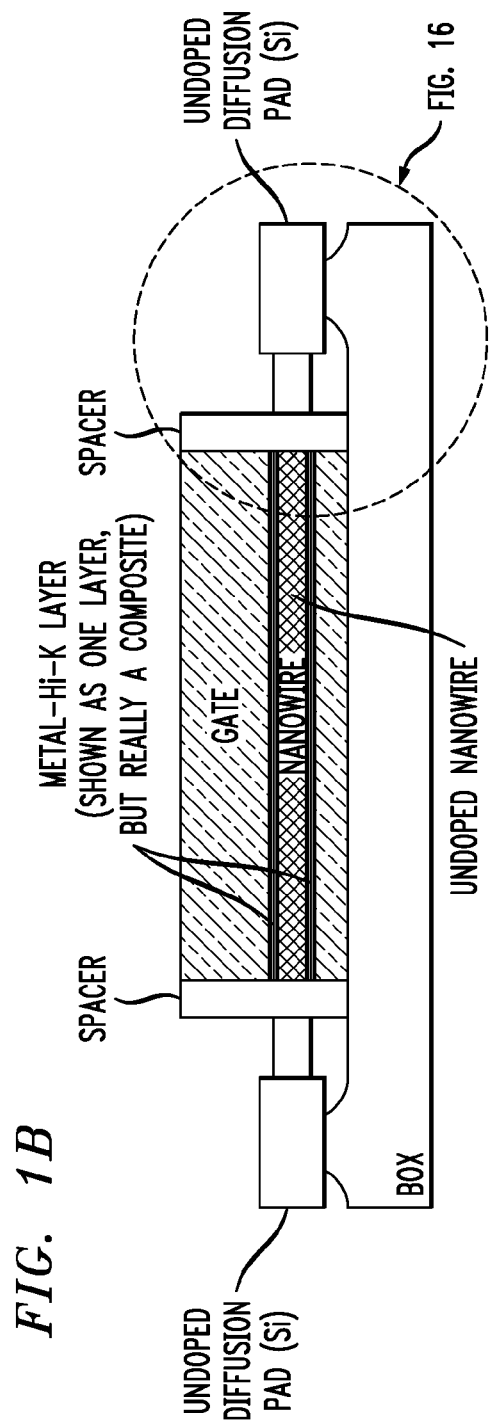
FIG. 1B is a cross-sectional diagram of a gate-all-around nanowire capacitor device having undoped source and drain regions according to an embodiment of the present invention.

In a second exemplary configuration, which is shown in FIG. 1B, the bi-directional capacitor devices are undoped, i.e., the devices have undoped source, drain and channel regions. In this case, in order to get bi-directional operation, the present techniques are employed to form the contact metal (i.e., silicide source and drain electrodes) which extends at least to an edge of the device gate, which permits the formation of a Schottky junction.

In general, the present process flow involves patterning a plurality of nanowires and pads in a wafer (labeled "Nanowire" and "Diffusion Pad" in FIG. 1A and FIG. 1B). A gate is formed that surrounds the nanowires in a gate-all-around configuration. See FIG. 1A and FIG. 1B. As shown in FIG. 1A and FIG. 1B, a dielectric may be present between the nanowires and the gate, and spacers are formed on opposite sides of the gate.

With regard to the doped source and drain configuration shown illustrated in FIG. 1A, ion implantation and annealing are used to dope the pads (and a portion of the nanowires). A portion of each of the nanowires remains undoped—and will serve as the channel regions of the device. As highlighted above, in order to get bi-directional operation, according to the present techniques, a contact metal (in this case a silicide which will serve as source and drain electrodes of the device, see below) is intentionally permitted to extend past a junction between the doped and undoped regions of the device, which permits the formation of a Schottky junction between the contact metal and the undoped portions of the device. As will be described in detail below, this can be achieved in several different ways which can be implemented individually, or alternatively in combination. The Schottky junction contact permits injection of both types of carriers (electrons and holes), which allows the capacitor to operate both in inversion and accumulation, whereas a normal junction contact only allows for operation in inversion mode and not accumulation mode. There are several circuit applications, such as on chip voltage converters, where having a capacitor which works on both positive and negative bias conditions, is advantageous.

In general, a nanowire capacitor includes two 'plates.' One of the plates, formed by the nanowires, serves as a channel between the source and drain electrodes. The gate (electrode) functions as the second plate, and serves to regulate current flow in the channel.

The formation of the metal silicide involves depositing a metal(s) (e.g., one or more of nickel (Ni), cobalt (Co) and/or platinum (Pt)—e.g., nickel platinum (NiPt)) on the pads/exposed portions of the nanowires followed by an anneal to react the metal(s) with the silicon in the nanowires and pads. The reaction will depend on the particular reaction conditions (e.g., annealing temperature, duration, etc.) employed. In the case of a complete reaction, the reaction will stop when stoichiometric silicide is achieved. It is not however necessary that stoichiometric silicide be formed in the present process. For instance, the present techniques may be applied even if the annealing conditions (e.g., annealing temperature and/or duration) do not permit complete reaction and non-stoichiometric silicide is the result. Non-stoichiometric silicide may result when annealing temperature and/or duration below that which would result in stoichiometric silicide are employed. The non-stoichiometric silicide might be "metal-rich" (i.e., the silicide contains a greater amount of metal than stoichiometric silicide) and thus consumes less silicon in the reaction. Thus, the silicide reaction can be controlled by controlling the amount of metal and/or the amount of silicon that is available for reaction. The present techniques employ this concept to control the amount of silicide that is formed and to ensure that the silicide extends into the undoped regions of the device.

Advantageously, the present techniques may be employed in the fabrication of an electronic device to selectively fabricate a nanowire capacitor(s) on a wafer, relative to other devices on the wafer. By way of example only, in one implementation described below, the present techniques are used to fabricate a nanowire capacitor(s) and a nanowire field-effect transistor (FET) on the same wafer. A nanowire FET operates essentially as a diode (uni-directional operation). Thus, in the case of a nanowire FET diode, it is desirable to have the contact metal (in this case a silicide which will serve as source and drain electrodes of the device, see below) to be formed only in the doped regions of the device. By comparison, as described by way of reference to FIG. 1A, above, with the nanowire capacitor devices it is desirable to intentionally permit the contact metal to extend beyond the doped regions of the device and into the undoped regions of the device. Advantageously, the present techniques can be employed to selectively control the amount of silicide formation in the capacitor (so as to achieve bi-directional operation) vis-à-vis the FET diode (so as to achieve uni-directional operation).

Specifically, several approaches are presented herein for controlling the silicide process, these include 1) using smaller spacers adjacent to the gate (see also expanded view of the device of FIG. 1A provided in FIG. 12, described below), 2) providing less silicon (e.g., no or reduced epitaxy on the pads/nanowires) and/or 3) depositing more (thicker) metal—thus providing more metal for the silicide reaction. Each of these approaches will be described by way of reference to the exemplary process flow shown illustrated in FIGS. 2-11 for fabricating a gate-all-around nanowire capacitor device and a nanowire FET diode on the same wafer.

With regard to nanowire capacitor device configuration having undoped source, drain, and channel regions shown illustrated in FIG. 1B, as highlighted above, in order to get bi-directional operation the contact metal (in this case a silicide which will serve as source and drain electrodes of the device, see below) is intentionally permitted to extend at least to an edge of the gate, which permits the formation of a Schottky junction between the contact metal and the (undoped) channel region of the device. The present techniques (i.e., 1) using smaller spacers adjacent to the gate, 2) providing less silicon and/or 3) depositing more (thicker) metal—thus providing more metal for the silicide reaction) implemented individually, or alternatively in combination, can be used to tailor the silicide formation process and achieve a silicide metal contact that extends at least to the edge of the capacitor device gate. It is notable that in this exemplary undoped source/drain nanowire capacitor configuration the silicide may extend beyond the edge of the gate and into the channel region. See, for example, FIG. 16 (described below). It is preferable however, that the silicide extend at least up to the edge of the gate.

By comparison, in the case of a nanowire FET diode, for instance, it is desirable to space the source and drain contacts from the gate edge. The present techniques may be implemented to efficiently and effectively tailor the silicide reaction to, e.g., produce nanowire capacitor and nanowire FET diode devices on the same wafer.

The present techniques are now described in detail by way of reference to the exemplary process flow shown illustrated in FIGS. 2-11 for fabricating a gate-all-around nanowire capacitor device and a gate-all-around nanowire FET diode on the same wafer.

The fabrication process begins with a semiconductor-on-insulator (SOI) wafer. See FIG. 2. An SOI wafer typically includes a layer of a semiconductor material (also commonly referred to as a semiconductor-on-insulator layer or SOI layer) separated from a substrate by an insulator. When the insulator is an oxide (e.g., silicon dioxide ($SiO_2$)), it is commonly referred to as a buried oxide, or BOX. According to the present techniques, the SOI layer will serve as an active layer of the device in which nanowire cores and pads will be patterned (see below).

Figure 2:
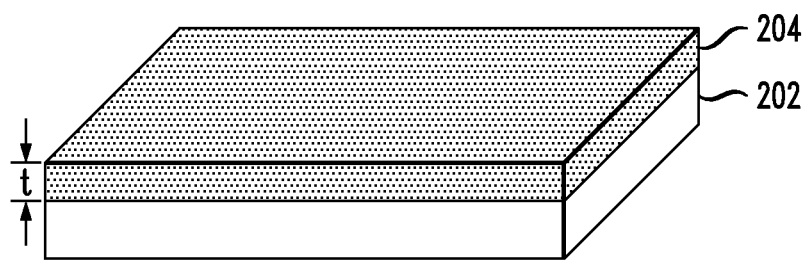
FIG. 2 is a three-dimensional diagram illustrating a semiconductor-on-insulator (SOI) wafer having a SOI layer over a buried oxide (BOX) which is a starting platform for fabrication of a gate-all-around nanowire capacitor device and a nanowire field effect transistor (FET) device according to an embodiment of the present invention.

In the example shown in FIG. 2, the starting wafer includes an SOI layer 204 over a BOX 202. For ease of depiction, a substrate typically located below the BOX 202, is not shown. According to an exemplary embodiment, SOI layer 204 is formed from a semiconducting material, such as silicon (Si) (e.g., crystalline silicon), silicon germanium (SiGe) or silicon carbon (SiC). Thus, the SOI layer 204 may also be referred to as a "semiconductor device layer" or simply as a "semiconductor layer."

According to an exemplary embodiment, SOI layer 204 preferably has a thickness t of from about 5 nanometers (nm) to about 40 nm. Commercially available SOI wafers typically have a thicker SOI layer. Thus, the SOI layer of a commercial wafer can be thinned using techniques such as oxidative thinning to achieve the desired active layer thickness for the present techniques.

Nanowires will be patterned in the SOI layer. As provided above, the nanowires will be used to form (undoped) channel regions of the device. Thus, it is preferable that the SOI layer 204 is undoped. The selective doping of (source/drain) regions of the SOI layer, if and where desired, can be performed later in the process. In the example shown illustrated in the figures, one nanowire capacitor and one nanowire FET diode are being fabricated on the wafer. This is merely an example being used to illustrate how the present process can be used to easily and selectively fabricate both types of devices on the same wafer. Of course, the same techniques can be used to produce multiple nanowire capacitors and/or nanowire FET diodes (or only nanowires capacitors if so desired).

Figure 3:
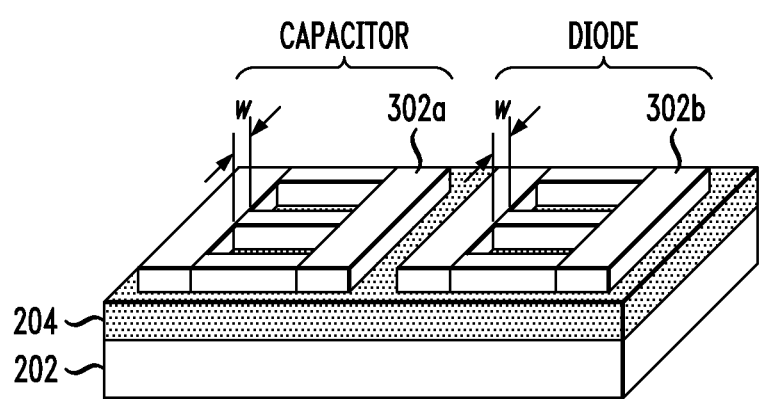
FIG. 3 is a three-dimensional diagram illustrating nanowire hardmasks (one corresponding to the nanowire capacitor device and the other corresponding to the nanowire FET device) having been formed on the SOI layer according to an embodiment of the present invention.
Figure 4:
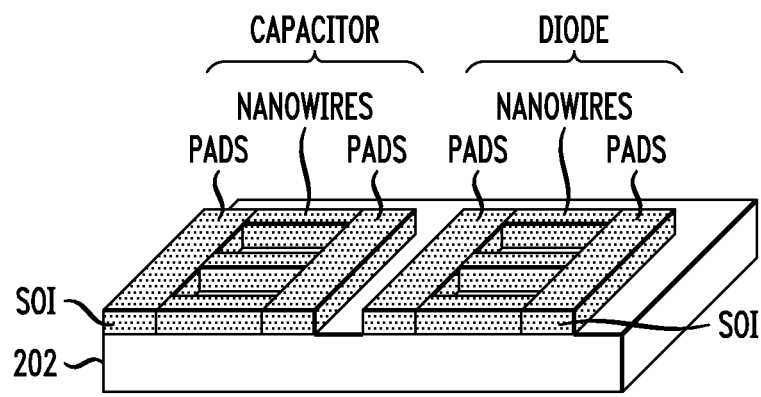
FIG. 4 is a three-dimensional diagram illustrating the hardmasks having been used to pattern a first set and a second set of nanowires and pads in the SOI layer (i.e., the first set of nanowires/pads correspond to the nanowire capacitor device and the second set of nanowires/pads correspond to the nanowire FET device) and the hardmasks having been subsequently removed according to an embodiment of the present invention.
Figure 5:
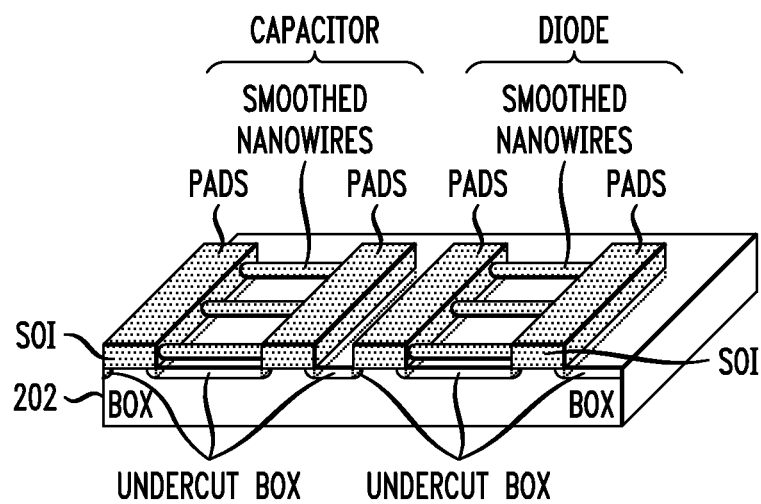
FIG. 5 is a three-dimensional diagram illustrating the nanowires having been suspended over the BOX by undercutting the BOX beneath the nanowires, and the nanowires having been smoothed according to an embodiment of the present invention.
Figure 6:
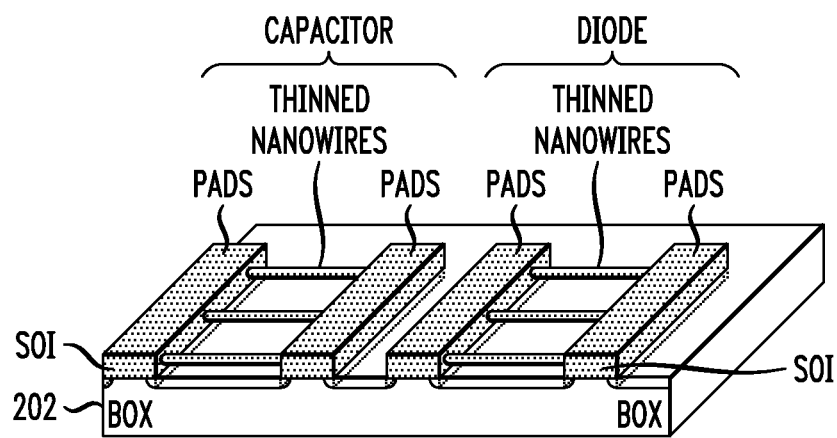
FIG. 6 is a three-dimensional diagram illustrating the nanowires having been thinned according to an embodiment of the present invention.

Patterning of the nanowires in the SOI layer 204 is now described. As shown in FIG. 3, standard lithography techniques are used to form hardmasks 302a/302b which will be used to pattern the nanowires and pads for the nanowire capacitor/nanowire FET diode, respectively, in the SOI layer 204 (also referred to herein as nanowire/pad lithography hardmasks). As shown in FIG. 3, the 'nanowire portions' of the hardmasks 302a/302b have a width w. By way of example only, hardmasks 302a/302b can be formed by blanket depositing a suitable hardmask material (e.g., a nitride material, such as SiN) over the SOI layer 204 and then patterning the hardmask material using a standard photolithography process with the footprint and location of the hardmasks 302a/302b. By way of another example (not shown), a soft mask (e.g., resist) can also be used to pattern the nanowires and pads in the SOI layer 204.

As shown in FIG. 3, the nanowire/pad hardmasks each have a ladder-like configuration. This ladder-like configuration will be transferred to the active layer, wherein the nanowires will be patterned like rungs of a ladder interconnecting the pads (see below).

An etch through the hardmasks 302a/302b is then used to form the nanowires and pads in the SOI layer 204. See FIG. 4. For clarity, the nanowires/pads for use in fabricating the nanowire capacitor device(s) may also be referred to herein as a first set of nanowires/pads, and the nanowires/pads for use in fabricating the nanowire FET diode device(s) may also be referred to herein as a second set of nanowires/pads. According to an exemplary embodiment, this etch is performed using reactive ion etching (RIE). For example, this RIE step may be performed using a fluorine-containing, e.g., $CHF_3/CF_4$, or bromine chemistry. As shown in FIG. 3, the nanowires and pads are formed having a ladder-like configuration. Namely, the pads are attached at opposite ends of the nanowires like the rungs of a ladder. The hardmasks 302a/302b may be removed at this stage with a selective wet etch process.

The nanowires are then suspended over the BOX. See FIG. 5. According to an exemplary embodiment, the nanowires are suspended by undercutting the BOX 202 beneath the nanowires using an isotropic etching process. This process also laterally etches portions of the BOX 202 under the pads. See FIG. 5. The isotropic etching of the BOX 202 may be performed, for example, using a diluted hydrofluoric acid (DHF). A 100:1 DHF etches approximately 2 nm to 3 nm of BOX layer 202 per minute at room temperature.

Following the isotropic etching of the BOX 202 the nanowires are preferably smoothed to give them an elliptical and in some cases a circular cross-sectional shape. The smoothing of the nanowires may be performed, for example, by annealing the nanowires in a hydrogen-containing atmosphere. Exemplary annealing temperatures may be from about 600 degrees Celsius (° C.) to about 1,000° C., and a hydrogen pressure of from about 600 torr to about 700 torr may be employed. Exemplary techniques for suspending and re-shaping nanowires may be found, for example, in U.S. Pat. No. 7,884,004 issued to Bangsaruntip et al., entitled "Maskless Process for Suspending and Thinning Nanowires," the entire contents of which are incorporated by reference herein. During this smoothing process, the nanowires are thinned. According to one exemplary embodiment, the nanowires at this stage have an elliptical cross-sectional shape with a cross-sectional diameter of from about 7 nm to about 35 nm.

Optionally, the nanowires can be thinned further. See FIG. 6. As described in conjunction with the description of FIG. 5, the nanowires may be re-shaped (e.g., smoothed) to an elliptical (e.g., circular) cross-sectional shape earlier in the process. Now, the nanowires may be further thinned, which also can serve to give them a smoother surface.

By way of example only, the nanowires may be further thinned at this step using a high-temperature (e.g., from about 700° C. to about 1,000° C.) oxidation of the nanowires followed by etching of the grown oxide. The oxidation and etching process may be repeated x number of times to achieve desired nanowire dimensions. According to one exemplary embodiment, the nanowires at this stage after being further thinned have a cylindrical cross-sectional shape with a cross-sectional diameter of from about 2 nm to about 20 nm, e.g., from about 3 nm to about 10 nm.

Figure 7:
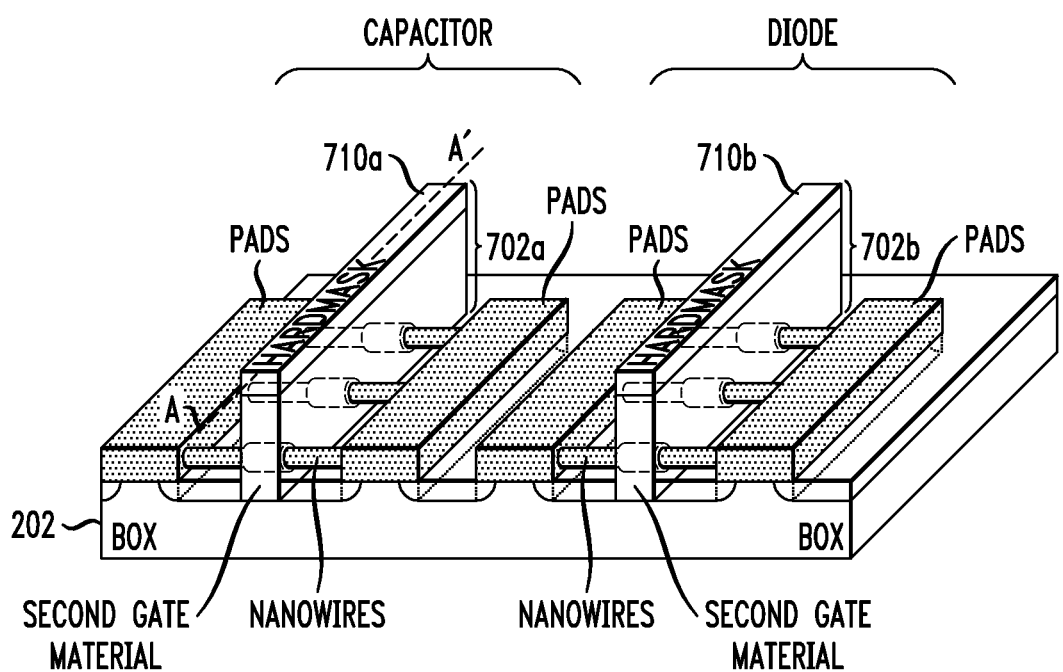
FIG. 7 is a three-dimensional diagram illustrating gate stacks having been formed surrounding the nanowires in a gate all around configuration according to an embodiment of the present invention.

Gate stacks 702a/702b are then patterned surrounding the nanowires in a gate all around configuration in both the nanowire capacitor and nanowire FET diode devices, respectively. See FIG. 7. The gate stacks will surround a portion of each of the nanowires that will serve as channel regions of the devices. Portions of the nanowires extending out from the gate stacks and the pads will serve as source and drain regions of the device. In this example, each of the gate stacks contains a dielectric (or combination of dielectrics), a first gate material (such as a metal(s)) and optionally a second gate material (such as a metal or doped polysilicon layer), all that surround the nanowires (see FIG. 8, described below, which provides a cross-sectional view through one of the gate stacks). As shown in FIG. 7, since the nanowires have been suspended over the BOX as described above, gate stacks 702a/702b completely surround at least a portion of each of the nanowires in a gate all around configuration.

Figure 8:
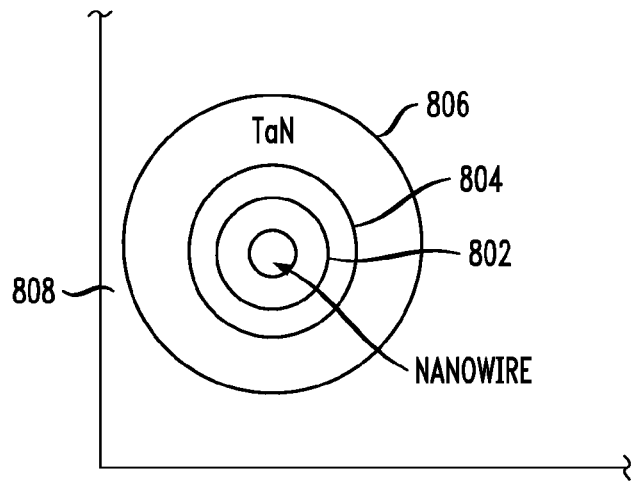
FIG. 8 is a cross-sectional diagram illustrating a cut through a portion of the gate stack being formed in the nanowire capacitor device (with the same process being applicable to the nanowire FET device) according to an embodiment of the present invention.

For ease of depiction, the formation of the gate stack 702a in the nanowire capacitor device is shown in FIG. 8 with the understanding that the same processes may be employed in the same manner to form the gate stack 702b in the nanowire FET diode device. For instance, the same gate stack configuration may be employed for both the nanowire capacitor and the nanowire FET diode devices. However, this is not necessary, and specific tailoring of the gate stack materials may be employed in each device, if so desired. Given the present description, one of skill in the art would be able to configure the gate stack materials/configurations for a particular given application.

As shown in FIG. 8 which provides a view of a cross-sectional cut (i.e., along line A-A') through a portion of gate stack 702a, according to an exemplary embodiment, gate stacks 702a/702b are formed by depositing a conformal gate dielectric film 802 such as silicon dioxide ($SiO_2$), silicon oxynitride (SiON), or hafnium oxide ($HfO_2$) (or other hi-K material) around the nanowires. Optionally, a second conformal gate dielectric film 804 that includes, for example, $HfO_2$, may be applied over gate dielectric film 802. A (first) gate material 806 is then deposited over the conformal gate dielectric film 802 (or over optional second conformal gate dielectric film 804). According to an exemplary embodiment, the gate material 806 is a conformal metal gate film that includes, for example, tantalum nitride (TaN) or titanium nitride (TiN).

Optionally, a second gate material 808 such as doped polysilicon or metal may then be blanket deposited onto the structure (i.e., over the gate material 806 so as to surround the nanowires). By way of reference to FIG. 7, hardmasks 710a/710b (e.g., nitride hardmasks, such as SiN) may then be formed on the second gate material 808, wherein hardmask 710a corresponds to a gate line of the nanowire capacitor device and hardmask 710b corresponds to a gate line of the nanowire FET diode device. Standard patterning techniques can be used to form the hardmasks 710a/710b. The gate material(s) and dielectric(s) are then etched by directional etching that results in straight sidewalls of the gate stacks 702a/702b, as shown in FIG. 7. If present, any remaining hardmask on the gate stack is also removed by the etching. Isotropic lateral etch is then performed to remove residue of the gate materials underneath nanowires, shadowed from the first directional etching (not shown). This process could be accomplished by RIE or a chemical wet method. After the lateral etching step, the gate stacks 702a/702b are formed over the suspended nanowires in the nanowire capacitor and nanowire FET diode devices, respectively.

Figure 9:
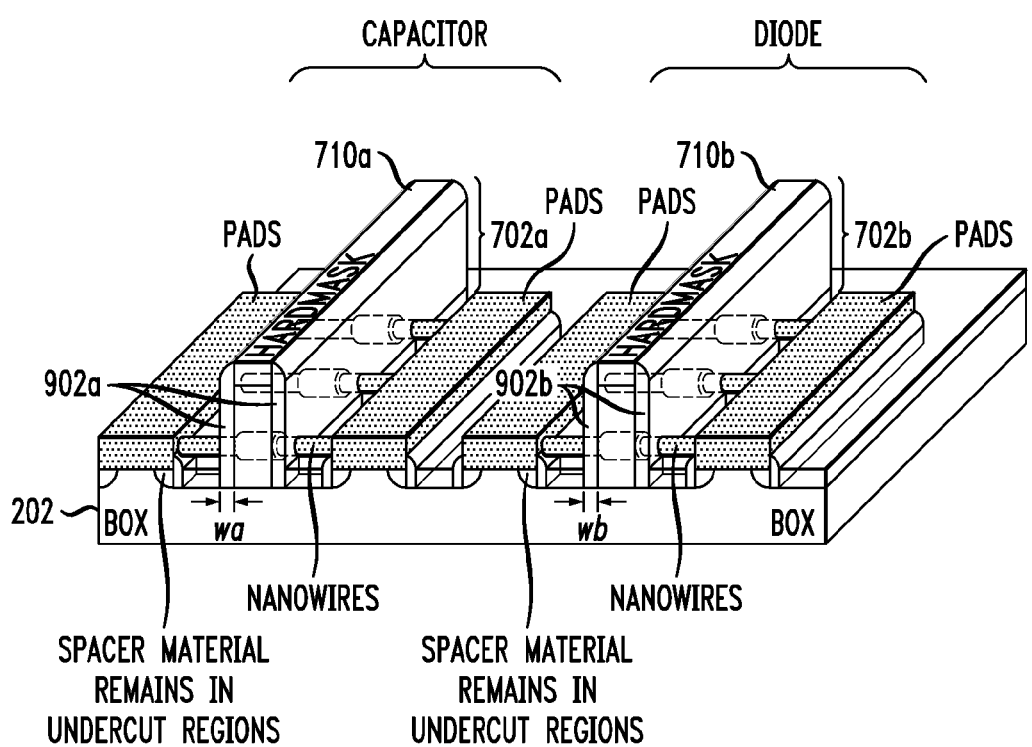
FIG. 9 is a three-dimensional diagram illustrating spacers having been formed on opposite sides of the gate stacks according to an embodiment of the present invention.
Figure 10:
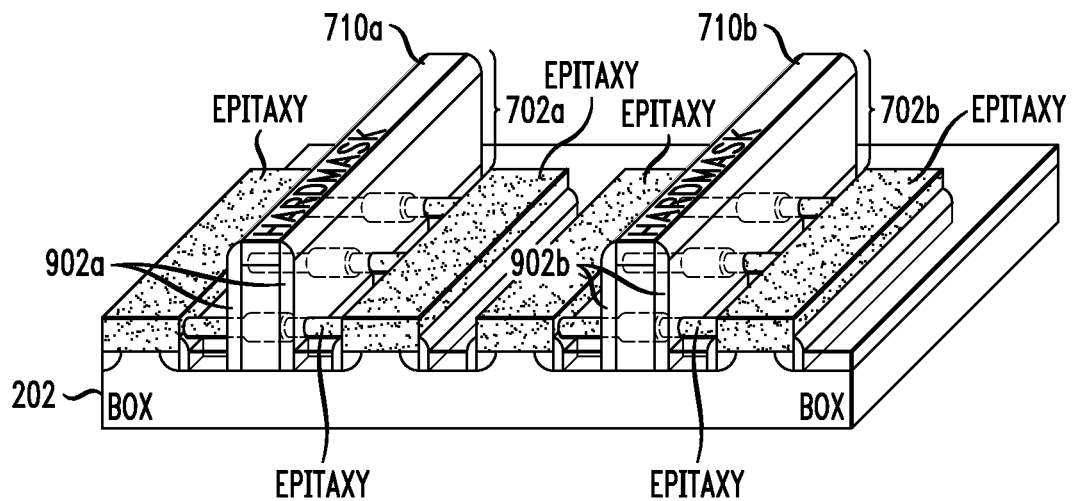
FIG. 10 is a three-dimensional diagram illustrating selective epitaxial growth having been used to thicken the exposed portions of the nanowires and pads (i.e., those portions of the nanowires not covered by a gate stack or spacers and the pads—these portions serving as either source or drain regions of the respective devices) according to an embodiment of the present invention.

Spacers 902a/902b are formed on opposite sides of gate stacks 702a/702b, respectively. See FIG. 9. According to an exemplary embodiment, spacers 902a/902b are formed by depositing a blanket dielectric film such as silicon nitride and etching the dielectric film from all horizontal surfaces by RIE. As shown in FIG. 9, some of the deposited spacer material can remain in the undercut regions, since the RIE in that region is blocked by the pads.

Spacers 902a/902b are used to separate the gate from the source and drain regions. According to the present techniques, the size of the spacers 902a and/or spacers 902b can be tailored based on the requirements of the silicide reaction. As highlighted above, this is the first approach described herein for controlling the silicide reaction. Basically, the size of spacers 902a/902b affects how much metal can be deposited on the source and drain regions of the respective devices (see below). The sizes of the spacers 902a/902b are characterized herein based on a width wa and wb of the spacers 902a/902b, respectively (see FIG. 9). Thus for instance, by reducing spacer width in the nanowire capacitor device from wa to a thinner size will provide a larger area for deposition of the silicide metal. As described above, for a given set of reaction conditions and a given amount of silicon present for reaction, depositing more metal will cause the silicide reaction to proceed farther into the device structure from the source and drain regions. In the nanowire capacitor device configuration having doped source and drain regions (see FIG. 1A) this means that the silicide reaction can be tailored to proceed past the doped (source/drain) regions, preferably consuming silicon from the undoped (channel) regions of the device (which are between the doped regions). As described above, this is the goal for the doped source and drain nanowire capacitor device to insure that the silicide formed extends from the doped regions of the device into the undoped regions of the device. In the nanowire capacitor device configuration having undoped source and drain regions (see FIG. 1B) this means that the silicide reaction can be tailored to proceed at least up to the edge of the gate (and potentially past the edge of the gate and into the (undoped) channel region).

According to an exemplary embodiment, blocking masks (not shown) are employed during the spacer RIE to produce spacers of differing widths. Standard lithography techniques can be used to pattern the blocking masks with the footprint (including size—e.g., width) and location of the spacers.

By contrast, as described above, with the nanowire FET diode device (to have unidirectional operation) it is desirable to have the source/drain contact metal (i.e., the silicide) remain within the doped regions of the device. It is notable that with the nanowire FET diode configurations, the source and drain regions are preferably always doped. Accordingly, if this technique of tailoring the spacer width is employed (either alone or in conjunction with one or more of the other techniques provided herein for controlling the silicide reaction) then the spacer width wa for the nanowire capacitor device would be smaller than the spacer width wb employed for the nanowire FET device, i.e., wa<wb, so as to insure that a greater amount of metal is deposited and a greater amount of silicide is formed in the nanowire capacitor as compared to the nanowire FET diode. This technique of tailoring the spacer width is further illustrated in FIG. 12, described below.

It is notable that the silicide reaction is dependent on multiple application-specific factors including, but not limited to, the particular silicide metal(s) being employed, the stoichiometry and crystal structure of the silicide formed, the anneal time and anneal temperature. See, for example, U.S. Pat. No. 6,124,639 issued to Domenicucci et al., entitled "Flat Interface for a Metal-Silicon Contact Barrier Film," (hereinafter "Domenicucci"), the entire contents of which are incorporated by reference herein. Thus, for a particular set-up and device configuration, including the specific materials and process parameters, the width of spacers 902a and/or spacers 902b can be adjusted until the appropriate amount of silicide is produced (based on the amount of metal that can be deposited—see above).

Specifically, factors such as the particular silicide metal(s) being employed, the stoichiometry and crystal structure of the silicide formed, the anneal time and anneal temperature, affect the ratio of silicon-to-metal consumed to form stoichiometric silicide. In order to form stoichiometric silicide the amount of metal should be greater than the amount of silicon divided by the ratio of silicon-to-metal consumed to form stoichiometric silicide. See, for example, U.S. Pat. No. 6,387,803 issued to Talwar et al., entitled "Method for Forming a Silicide Region on a Silicon Body," (hereinafter "Talwar"), the entire contents of which are incorporated by reference herein. The amounts of silicon and metal can be quantified based on the thickness of the respective layers (e.g., the thickness of the initial silicon layer and then the thickness of the metal are what are considered), since during the silicide reaction, a fixed amount of silicon will be consumed by the metal.

Optionally, next a selective epitaxial material (labeled "Epitaxy") such as Si, SiGe, or SiC is then grown to thicken the exposed portions of the nanowires and pads (i.e., those portions not covered by a gate stack or spacers). See FIG. 10. This step is optional, and can be selectively employed for one or more of the devices on the wafer (irrespective of the other device(s)). For instance, as will be described in detail below, in the case of the nanowire capacitor device, the amount of silicon present for the silicide reaction may be tailored such that reduced or even no epitaxial silicon is needed. However, it may be desirable to form epitaxial silicon (or more epitaxial silicon) in the source/drain regions of the nanowire FET diode device(s) (if present). This way, more silicon is available for the silicide reaction in the doped source/drain regions of the nanowire FET diode device(s) (as compared to the nanowire capacitor device). Accordingly, in the case of the nanowire FET diode device, the availability of more silicon in the source/drain regions for the silicide reaction will help insure that the silicide does not spread beyond the doped regions of the device. Conversely, in the case of the nanowire capacitor device, having less silicon available in the source/drain regions for the silicide reaction will help insure that the silicide forms beyond the doped regions of the device and extends into the undoped regions of the device (in the case of the nanowire capacitor device configuration having doped source and drain regions (see FIG. 1A)) or extends at least up to the edge of the gate (in the case of the nanowire capacitor device configuration having undoped source and drain regions (see FIG. 1B).

Accordingly, embodiments are considered herein where the epitaxial material is grown to thicken the exposed portions of the nanowires and pads (i.e., those portions not covered by a gate stack or spacers) only in the nanowire FET diode device(s) selectively such that no epitaxial material is formed in the capacitor devices. Again, as provided above, tailoring to the process to attain selective epitaxial growth in one or more of the devices would be within the capabilities of one of skill in the art. In this case, the source and drain regions of the nanowire capacitor may be undoped (while the source and drain regions of the nanowire FET are doped). The same processes described herein regarding tailoring the spacer width, tailoring the amount of metal available for the silicide reaction and/or tailoring the amount of silicon available for the silicide reaction can be employed in the case of an undoped nanowire capacitor device. Namely, by tailoring the amount of silicide produced, with desirably a greater amount of silicide being produced in the nanowire capacitor device vis-à-vis the nanowire FET device, will have an effect on the extrinsic (external) resistance to the capacitor.

The growth process might involve epitaxially growing, for example, in-situ doped Si, SiGe or SiC that may be either n-type or p-type doped. The in-situ doped epitaxial growth process forms the doped regions of the nanowire capacitor device. Reference to FIG. 1A shows these doped regions having hatched patterning. By contrast, reference to FIG. 1B shows that the source and drain regions in the capacitor device are undoped. It is notable that in either case, if a nanowire FET diode is being co-fabricated on the same wafer, the diode would preferably have doped source and drain regions.

By way of example only, a chemical vapor deposition (CVD) reactor may be used to perform the epitaxial growth. For example, for silicon epitaxy, precursors include, but are not limited to, $SiCl_4$, $SiH_4$ combined with HCL. The use of chlorine allows selective deposition of silicon only on exposed silicon. A precursor for SiGe growth may be $GeH_4$, which may obtain deposition selectivity without HCL. Precursors for dopants may include $PH_3$ or $AsH_3$ for n-type doping and $B_2H_6$ for p-type doping. Deposition temperatures may range from about 550° C. to about 1,000° C. for pure silicon deposition, and as low as 300° C. for pure Ge deposition.

According to an exemplary embodiment, blocking masks (not shown) are employed during this epitaxy step to selectively form epitaxial regions of varying sizes/amounts. The blocking masks can be formed using standard lithography techniques. For instance, a blocking mask may be formed over the source and drain regions of the capacitor device(s), and thus the epitaxy will be selective for growth on the source and drain regions of the nanowire FET diode device(s). If undoped nanowire capacitor source and drain regions are the goal (see, for example FIG. 1B), then the epitaxial process can end there, the result being a greater amount of silicon (due to the epitaxy) being present in source and drain regions of the nanowire FET diode—as compared to the nanowire capacitor device, thus insuring that the silicide reaction proceeds farther in the nanowire capacitor device. By not performing an epitaxy on the source and drain regions of the capacitor device(s), these regions will remain undoped (see FIG. 1B).

On the other hand, if doped nanowire capacitor source and drain regions are the goal (see, for example FIG. 1A), then a second epitaxy can be performed wherein the blocking mask is removed and epitaxy is performed on the source and drain regions of the capacitor and diode devices concurrently. Accordingly, since multiple rounds of epitaxy are performed on the source and drain regions of the nanowire FET diode device(s) then more epitaxial material will be formed in those regions as compared to the source and drain regions of the nanowire capacitor device(s) which sees only one round of epitaxy based on the above process. Again, this would insure that the silicide reaction proceeds farther in the nanowire capacitor device.

As provided above, the amount of silicon present for the silicide reaction can be selectively tailored to insure that 1) in the case of the nanowire capacitor device(s), that the silicide formed extends from the doped (source/drain) regions of the device into the undoped regions of the device (in the case of the nanowire capacitor device configuration having doped source and drain regions (see FIG. 1A)) or extends at least up to the edge of the gate (in the case of the nanowire capacitor device configuration having undoped source and drain regions (see FIG. 1B), and that 2) in the case of the nanowire FET diode device(s) (if present), that the silicide formation is restricted to the doped (source/drain) regions of the device. Since, as described above, for a given set of reaction conditions and a given amount of deposited metal altering the amount of silicon present for reaction will affect the amount of silicide produced. For instance, in the case of the nanowire capacitor device(s), decreasing the amount of silicon present for reaction will cause the silicide reaction to proceed past the doped (source/drain) regions, preferably consuming silicon from the undoped (channel) regions of the device that are therebetween (in the case of the nanowire capacitor device configuration having doped source and drain regions (see FIG. 1A)) or consume silicon at least up to the edge of the gate (in the case of the nanowire capacitor device configuration having undoped source and drain regions (see FIG. 1B)). Employing a greater amount of silicon in the nanowire FET diode device(s)—if present (again for a given amount of deposited metal) will limit the silicide reaction to the doped source and drain regions of the device. A simple example may be used to illustrate this concept. If X amount of metal is present in the source/drain regions of both the nanowire capacitor device and the nanowire FET diode device, and if Y amount of silicon is present in the source/drain regions of the nanowire capacitor device and Z amount of silicon present in the source/drain regions of the nanowire FET diode device, wherein $Y<Z$, and the silicide reaction is carried out under the same conditions (annealing at the same temperature and for the same duration) in both devices, then a greater amount of silicide can be formed in the source/drain regions of the nanowire FET device before silicon outside of the source/drain regions is consumed. Ideally, the amounts of metal/silicon present in each of the devices for reaction is tailored such that the reaction under a given set of conditions (i.e., annealing temperature/duration) produces 1) silicide that extends from the doped source/drain regions into the undoped regions of the nanowire capacitor device(s) (in the case of the nanowire capacitor device configuration having doped source and drain regions (see FIG. 1A)) or consume silicon at least up to the edge of the gate (in the case of the nanowire capacitor device configuration having undoped source and drain regions (see FIG. 1B) and 2) silicide in only the source and drain regions of the nanowire FET diode device(s). Thus, the amount of epitaxial silicon formed in this step, if any (see above), is dependent on the desired end result silicide reaction. In practice, the amount of epitaxial silicon formed can be controlled by the growth time and temperature (the growth temperature impacts the growth rate), and could easily be tailored by one of ordinary skill in the art to selectively produce different amounts of epitaxial silicon in the nanowire capacitor device(s) vis-à-vis the nanowire FET diode device(s).

As described above, the silicide reaction is dependent on multiple application-specific factors including, but not limited to, the particular silicide metal(s) being employed, the stoichiometry and crystal structure of the silicide formed, the anneal time and anneal temperature. See, for example, Domenicucci. These factors affect the ratio of silicon-to-metal consumed to form stoichiometric silicide. Thus, for a particular set-up and device configuration, including the specific materials and process parameters, the amount of epitaxial silicon formed can be adjusted until the appropriate amount of silicide is produced. Determining the amount of epitaxial silicon would be within the capabilities of one of skill in the art.

It is notable that the approaches described herein for tailoring the silicide process do not have to be used independently of one another. For instance, the technique described above to tailor the spacer width can be used alone or in combination with the approach now being described to control the amount of epitaxial silicon available for reaction and/or the approach described below to deposit a greater/lesser amount of metal for the silicide reaction. By way of example only, it may be the case that (for a given set of parameters) scaling the spacer width increases the amount by which the silicide formed extends into the nanowire capacitor device(s), but not enough (i.e., the silicide does not extend far enough to transcend the doped/undoped junctions or does not extend up to the edge of the gate). Thus, decreasing the amount of silicon and/or increasing the amount of deposited metal for the silicide reaction (as described herein) may additionally be employed to further fine-tune the reaction.

Figure 11:
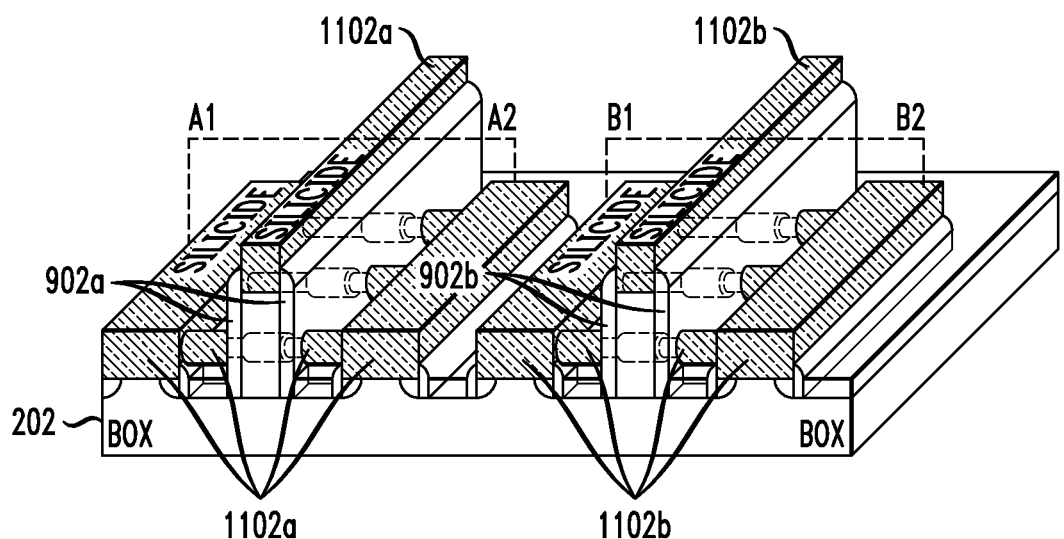
FIG. 11 is a three-dimensional diagram illustrating a contact material having been formed on the exposed epitaxial material according to an embodiment of the present invention.

Finally, the contact material, in this case a silicide 1102a/1102b (formed from the epitaxial Si, SiGe or SiC—in the regions where the optional epitaxy was performed and/or from the nanowire/pads SOI material—in the regions where epitaxy was not performed) is formed on the exposed nanowire/pad material (either with or without an epitaxial material thereon). See FIG. 11. It is notable that FIG. 11 depicts the exemplary situation wherein epitaxial material was grown on the source and drain regions of both the nanowire capacitor and nanowire FET diode devices. This is merely exemplary since, as described above, in some embodiments epitaxy is not performed on the source and drain regions of the capacitor device(s). Further, as highlighted above, the amount of the epitaxial material, if formed on both types of devices, may be selectively different to control the silicide reaction now being described.

Examples of contact materials include, but are not limited to, nickel silicide, cobalt silicide, or platinum silicide. By way of example only, formation temperatures can be from about 400° C. to about 600° C. As described above, the silicide process involves reacting a deposited metal(s) (such as nickel and/or cobalt) with silicon (e.g., the SOI nanowire/pad material and/or the epitaxial silicon formed in the previous step). With the present techniques (in order to form a bi-directional nanowire capacitor) for the nanowire capacitor device(s) being formed it is desirable for the silicide to be formed extending through the doped (source/drain) regions of the device and into the undoped (nanowire channel) regions of the device (in the case of the nanowire capacitor device configuration having doped source and drain regions (see FIG. 1A)) or extending at least up to the edge of the gate (in the case of the nanowire capacitor device configuration having undoped source and drain regions (see FIG. 1B). By contrast, for the nanowire FET diode device(s) being formed it is desirable to limit the silicide formation to the doped source/drain regions of the device.

As provided above, the amount of metal present for the silicide reaction can be tailored to ensure that the silicide formed extends from the doped (source/drain) regions of the device into the undoped regions of the device of the nanowire capacitor device(s) (in the case of the nanowire capacitor device configuration having doped source and drain regions (see FIG. 1A)) or extend at least up to the edge of the gate (in the case of the nanowire capacitor device configuration having undoped source and drain regions (see FIG. 1B)), yet remains within the doped source/drain regions of the nanowire FET device(s). For a given set of reaction conditions (annealing temperature/duration) and a given amount of silicon, increasing/decreasing the amount of metal present will alter the silicide reaction. A similar example to that provided above may be used to illustrate this concept. If X amount of silicon is present in the source/drain regions of both the nanowire capacitor device and the nanowire FET diode devices, and if Y amount of metal is present in the source/drain regions of the nanowire capacitor device and Z amount of metal present in the source/drain regions of the nanowire FET diode device, wherein Y>Z, and the silicide reaction is carried out under the same conditions (annealing at the same temperature and for the same duration) in both devices, then the greater ratio of metal to silicon in the source/drain regions of the nanowire capacitor device (as compared to the nanowire FET device) will result in silicon outside of the source/drain regions being consumed in the reaction. Ideally, the amounts of metal/silicon present in each of the devices for reaction is tailored such that the reaction under a given set of conditions (i.e., annealing temperature/duration) produces 1) silicide that extends from the doped source/drain regions into the undoped regions of the nanowire capacitor device(s) or at least up to the edge of the gate and 2) silicide in only the source and drain regions of the nanowire FET diode device(s). As the example immediately above illustrates, increasing the amount of metal present can be used to cause the silicide reaction to proceed past the source/drain regions, preferably consuming silicon from the undoped regions of the device. Thus, the amount of metal deposited in this step is dependent on the desired end result silicide reaction.

As described above, the silicide reaction is dependent on multiple application-specific factors including, but not limited to, the particular silicide metal(s) being employed, the stoichiometry and crystal structure of the silicide formed, the anneal time and anneal temperature. See, for example, Domenicucci. These factors affect the ratio of silicon-to-metal consumed to form stoichiometric silicide. Thus, for a particular set-up and device configuration, including the specific materials and process parameters, the amount of metal deposited can be adjusted until the appropriate amount of silicide is produced. Determining the amount of metal to deposit would be within the capabilities of one of skill in the art.

As shown in FIG. 11, in this step silicide is also formed on the gate stacks 702a/702b to form a gate electrode. This is a desired result. It is, however, undesirable to deposit any extra metal on the gate stacks and/or it may be undesirable to deposit any extra metal on the nanowire FET diode device(s)—if present. By comparison, as described above, it may be desirable to deposit extra silicide-forming metal on the source/drain regions of the nanowire capacitor device(s) to ensure that the resulting silicide extends into the undoped (channel) regions of the device (FIG. 1A) or that the resulting silicide extends at least to the edge of the gate (FIG. 1B).

According to an exemplary embodiment, a blocking mask (not shown) is employed during the silicide metal deposition to deposit differing amounts of metal for the source/drain contact formation in the nanowire capacitor device(s) vis-à-vis the nanowire FET diode device(s). Standard lithography techniques can be used to pattern the blocking mask. For instance, the blocking mask may be formed blocking the source and drain regions of the nanowire FET diode device(s) thus permitting selective deposition of silicide metal on the source and drain regions of the nanowire capacitor device(s). The blocking mask can be removed and a second deposition of silicide metal can be performed on the nanowire capacitor and nanowire FET diode devices concurrently. The result will be a greater amount of silicide metal having been deposited on the nanowire capacitor device(s) since the nanowire capacitor device(s) will see multiple metal deposition steps whereas the nanowire FET diode device(s), due to the blocking mask, will see only a single metal deposition step. This will insure that the silicide formed will extend farther into the device from the source and drain regions of the capacitor device(s) as compared to the nanowire FET diode device(s).

Again, the approaches described herein for tailoring the silicide process do not have to be used independently of one another. For instance, the techniques described above to tailor the spacer width and/or control the amount of epitaxial silicon can be used alone or in combination with the approach now being described to control the amount of metal available for reaction.

Figure 12:
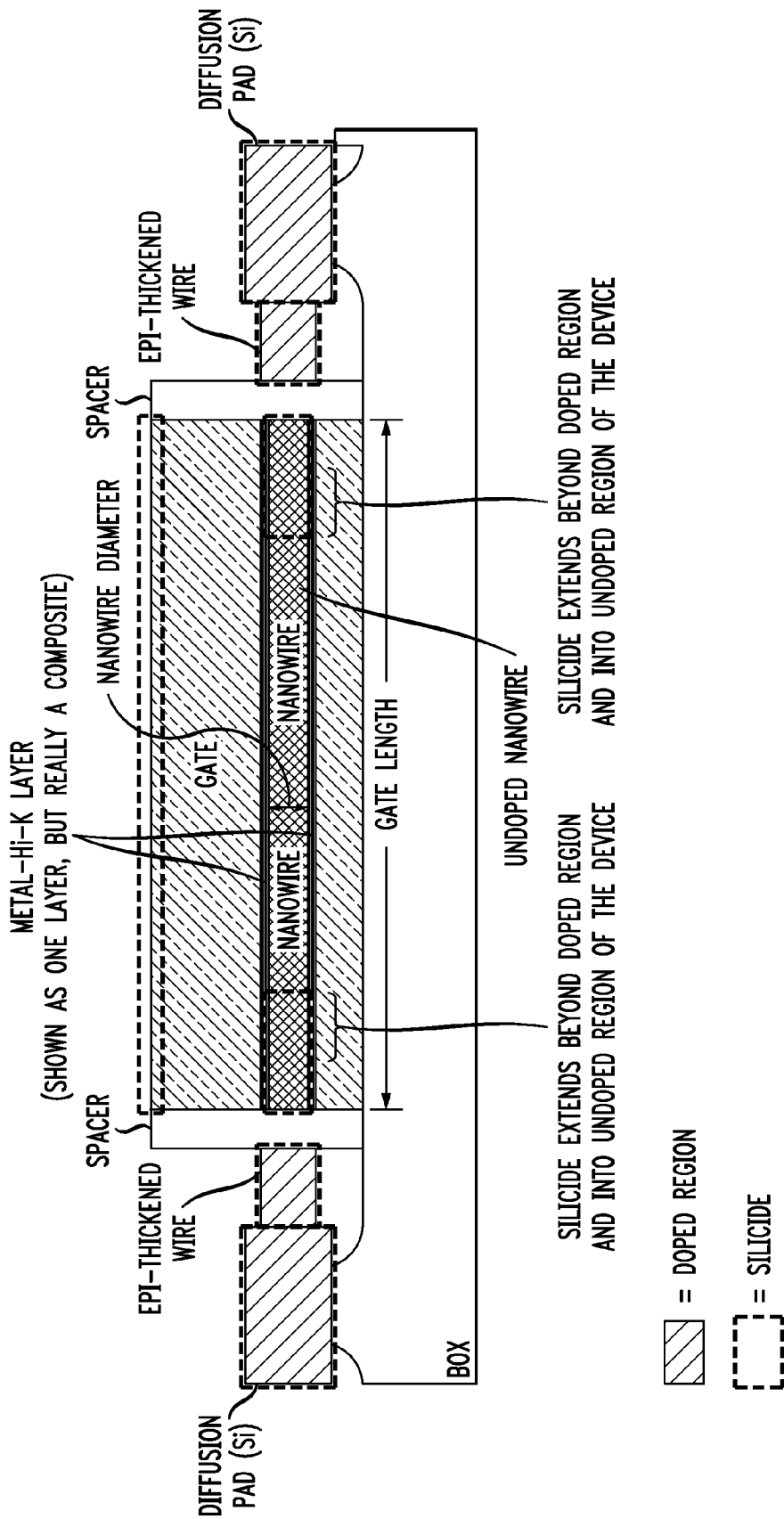
FIG. 12 is a cross-sectional diagram illustrating how by employing one or more of the present techniques to control the silicide reaction, the resulting contact metal silicide extends beyond the doped source/drain regions of the nanowire capacitor device and into the undoped regions of the nanowire capacitor device according to an embodiment of the present invention.

Like FIG. 1A, FIG. 12 is a cross-sectional cut through the present nanowire capacitor device structure, e.g., a cross-sectional cut through the nanowire capacitor device along line A1-A2 (see FIG. 11) in the exemplary configuration wherein the source and drain regions of the capacitor device are doped. As shown in FIG. 12, based on employing one or more of the above described approaches to control the silicide reaction, the resulting contact metal silicide extends beyond the doped (source/drain) regions of the nanowire capacitor device and into the undoped (channel) regions of the nanowire capacitor device. As with FIG. 1A, the doped regions are represented with hatched patterning. The silicide region is outlined in a dashed line.

Figure 13:
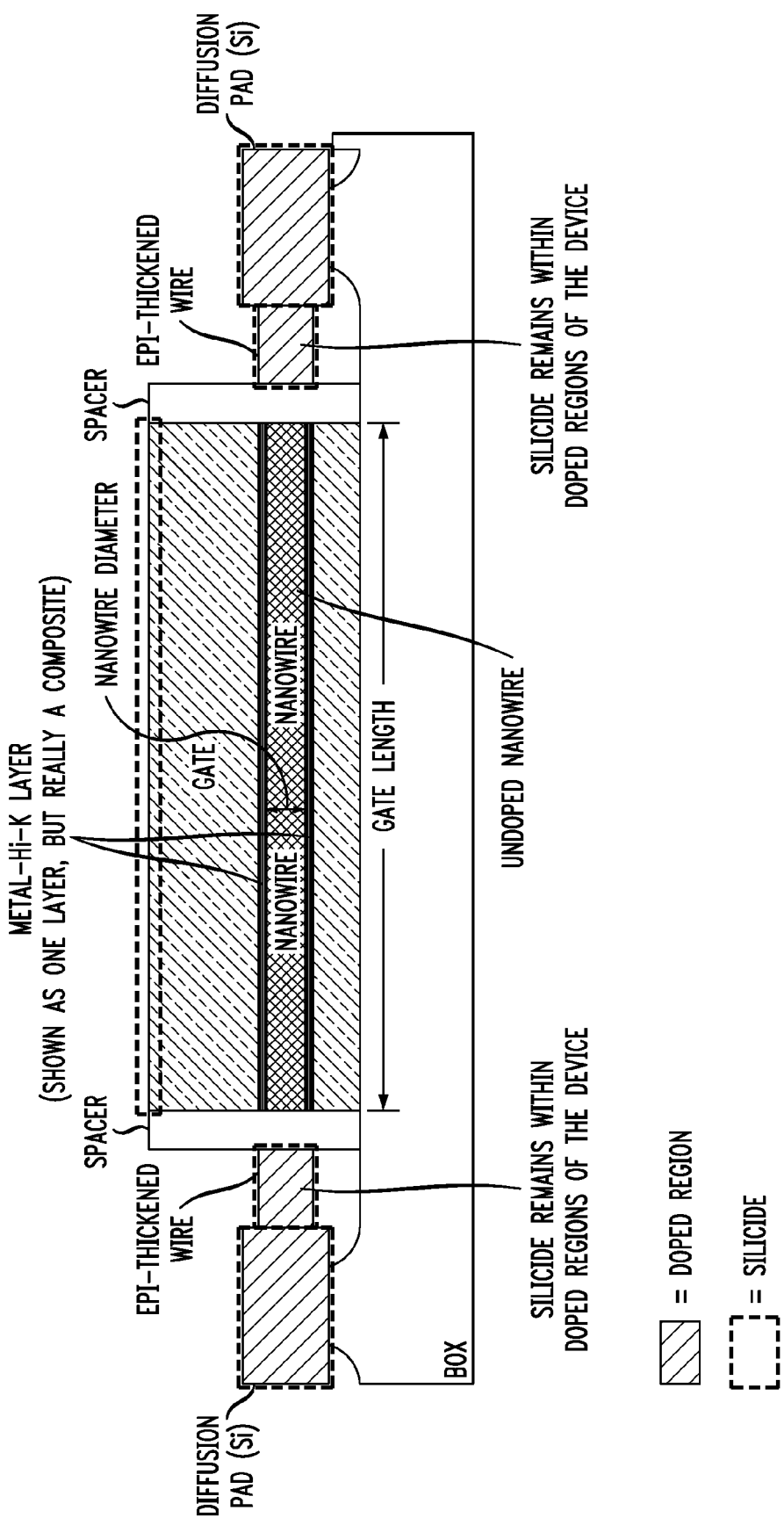
FIG. 13 is a cross-sectional diagram illustrating how by employing one or more of the present techniques to control the silicide reaction, the resulting contact metal silicide remains within the doped source/drain regions of the nanowire FET device according to an embodiment of the present invention.

As highlighted throughout the description, the present techniques may be used to selectively achieve bi-directional operation in nanowire capacitor devices vis-à-vis other uni-directional devices (e.g., nanowire FET diode devices) produced on the same wafer. This selectivity is achieved by producing 1) silicide that extends from the doped source/drain regions into the undoped regions of the nanowire capacitor device(s) (in the case of the nanowire capacitor device configuration having doped source and drain regions (see FIG. 1A)) or that extends at least up to the edge of the gate (in the case of the nanowire capacitor device configuration having undoped source and drain regions (see FIG. 1B)) and 2) silicide in only the source and drain regions of the nanowire FET diode device(s). FIG. 13 is a cross-sectional cut through the present nanowire FET diode device structure, e.g., a cross-sectional cut through the nanowire FET device along line B1-B2 (see FIG. 11). As shown in FIG. 13, based on employing one or more of the above described approaches to control the silicide reaction, the resulting contact metal silicide remains within the doped (source/drain) regions of the nanowire FET diode device. As with FIG. 1, the doped regions are represented with hatched patterning. The silicide region is outlined in a dashed line.

As described above, according to some exemplary embodiments provided herein, the source and drain regions of the nanowire capacitor device(s) are undoped, while the source and drain regions of the nanowire FET diode device(s) are selectively doped. In that example, the present techniques for tailoring the spacer width and/or tailoring the amount of metal available for silicide reaction and/or tailoring the amount of silicon available for the silicide reaction are employed to produce a greater amount of silicide in the nanowire capacitor device(s) as compared to the nanowire FET device(s) to insure that the silicide produced in the nanowire capacitor device(s) extends at least up to the edge of the gate. As described above, this will have a beneficial effect on the extrinsic (external) resistance to the capacitor. As also provided above, the silicide reaction, based for example on the reaction conditions (e.g., annealing duration, temperature, etc.) may go to completion resulting in stoichiometric silicide, or it may be an incomplete reaction, forming for instance metal-rich silicide. Regardless, for a given set of silicide reaction conditions (assuming that the same silicide reaction conditions are employed for the nanowire capacitor device(s) as for the nanowire FET device(s)) employing the present techniques will result in a greater amount of silicide being formed in the nanowire capacitor device verses the nanowire FET diode device. The amount of silicide formed can easily be quantified using conventional analytic methods to verify the results of the present process.

Figure 14:
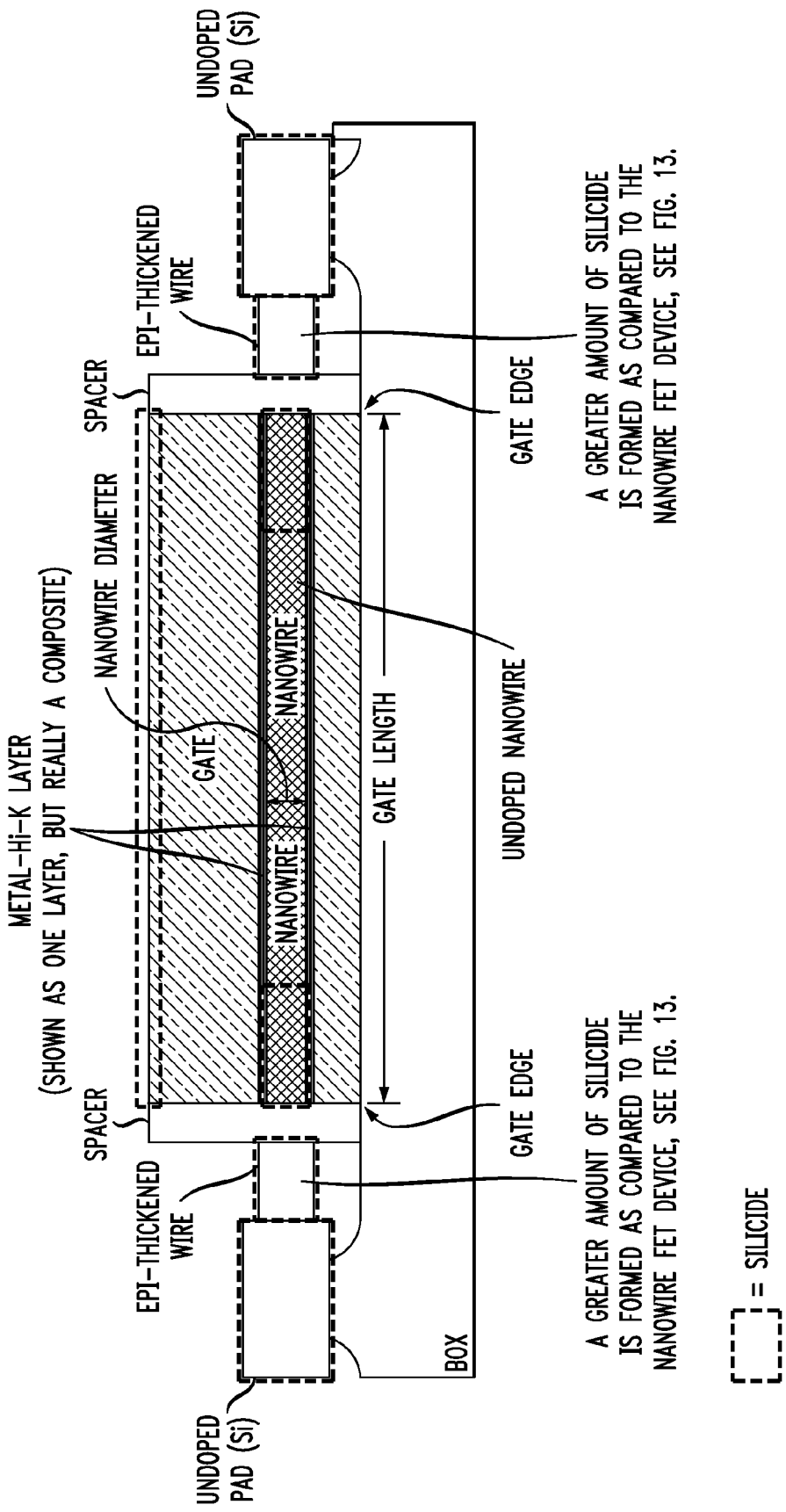
FIG. 14 is a cross-sectional diagram illustrating how by employing one or more of the present techniques to control the silicide reaction, an amount of the resulting contact metal silicide is greater than that produced in the nanowire FET device (compare with FIG. 13) according to an embodiment of the present invention.

FIG. 14 is a cross-sectional cut through the present nanowire capacitor device structure, e.g., a cross-sectional cut through the nanowire capacitor device along line A1-A2 (see FIG. 11). By comparison with the depiction shown in FIG. 12, in FIG. 14 the exemplary configuration is shown where the nanowire capacitor device is undoped. As shown in FIG. 14, based on employing one or more of the above described approaches to control the silicide reaction, an amount of the resulting contact metal silicide is greater than that being formed in the nanowire FET device(s) (compare the cut through the nanowire capacitor device shown in FIG. 14, with the cut through the nanowire FET shown in FIG. 13). It is notable by way of reference to FIG. 13 that the source and drain regions of the nanowire FET in this example are doped and that the silicide formed therein remains in the doped regions. As described above, this particular configuration may be achieved by selectively doping the nanowire FET diode source and drain regions (selective to the nanowire capacitor—which remains undoped) and by selectively tailoring the spacer width, amount of metal available for silicide reaction and/or the amount of silicon available for silicide reaction in the nanowire FET diode vis-à-vis the nanowire capacitor. In FIG. 14, the silicide region is outlined in a dashed line. As shown in FIG. 14, the silicide regions extends at least up to the edge of the gate, and in fact in this case the silicide region extends past the gate edge and into the channel region of the device.

Once the contact metal formation is performed, capping layers and vias for connectivity (not shown) may be formed.

Figure 15:
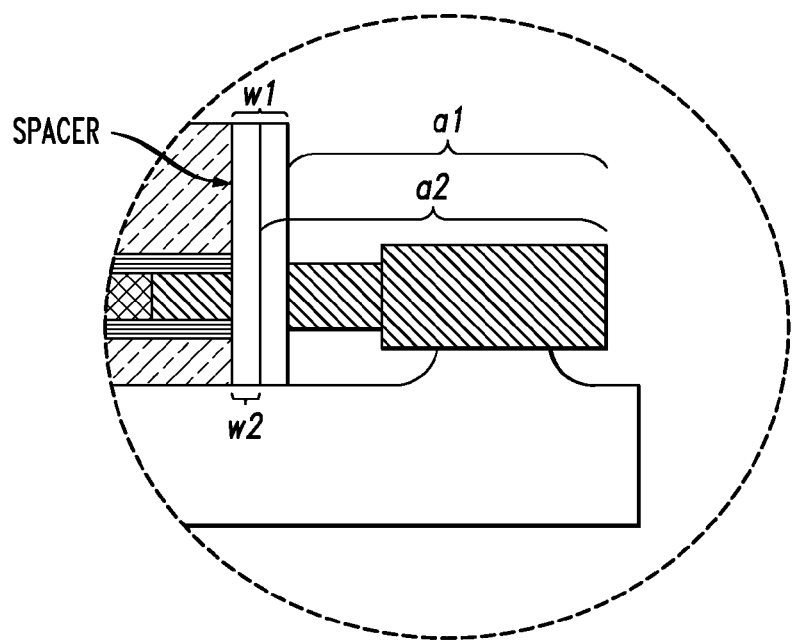
FIG. 15 is a cross-sectional diagram of an enlarged section of the device of FIG. 1A illustrating how decreasing spacer width increases source/drain area according to an embodiment of the present invention.

FIG. 15 is a cross-sectional diagram of an enlarged section of the device of FIG. 1A. Specifically, FIG. 15 illustrates how altering (in this case reducing) the spacer width w can alter (in this case increase) source/drain area. By altering (decreasing/increasing) source/drain area, more or less silicide-forming metal can be deposited. Referring to FIG. 15, by decreasing a width of the spacer from w1 to w2, wherein w2 is less than w1, the area available for metal (silicide) deposition is increased from a1 to a2. Since FIG. 15 depicts an enlarged section of the device of FIG. 1A, for ease and clarity of description, some of the labels are omitted in FIG. 15 with the understanding that the structures and features shown in FIG. 15 are the same as that shown in FIG. 1A, and are described above.

Figure 16:
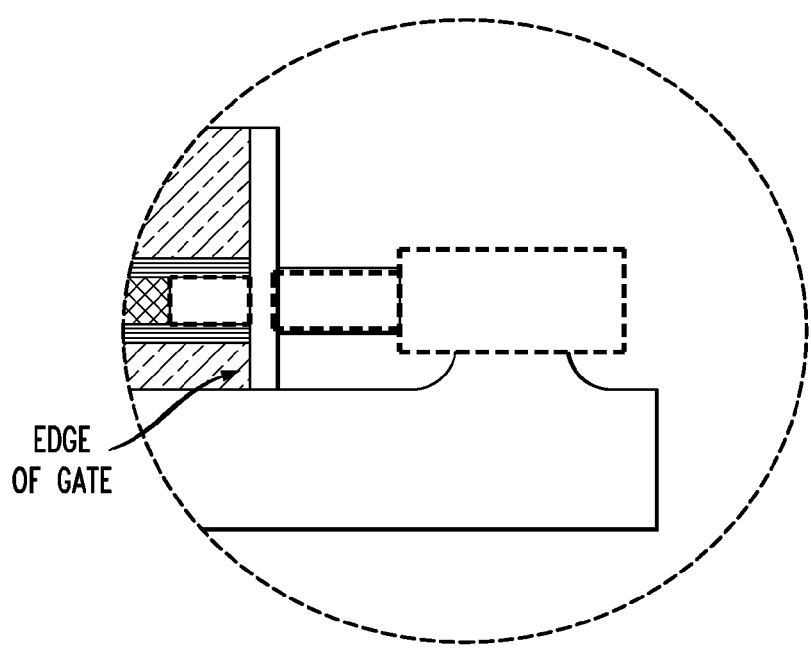
FIG. 16 is a cross-sectional diagram of an enlarged section of the device of FIG. 1B illustrating how the present techniques can be employed to insure that the silicide formed extends at least to an edge of the gate of the capacitor device according to an embodiment of the present invention.

FIG. 16 is a cross-sectional diagram of an enlarged section of the device of FIG. 1B (which depicts the capacitor configuration wherein the source and drain regions are undoped). Specifically, FIG. 16 illustrates how by employing one (or more) of the techniques provided herein for controlling the silicide reaction, the silicide region (outlined in a dashed line) can be tailored to extend up to (or beyond) edge of the gate. Since FIG. 16 depicts an enlarged section of the device of FIG. 1B, for ease and clarity of description, some of the labels are omitted in FIG. 16 with the understanding that the structures and features shown in FIG. 16 are the same as that shown in FIG. 1B, and are described above.

Additionally, the desired size of the nanowires (measured based on nanowire diameter or Dnw) and the desired size of the gate (measured based on gate length or Lg) will likely be different from that of a FET diode device. In order to build up larger amounts of capacitance, it is likely that the gate wire length will be longer. If accuracy is important, larger diameter wires are used, where the capacitance per unit area is constant, see below. If achieving a large capacitance value in a fixed size region is more important, then smaller diameter wires (at an aggressive wire-to-wire pitch) would be used. Referring back to FIGS. 12 and 13, the nanowire diameter and gate length dimensions are illustrated.

With regard to nanowire diameter and capacitance, nanowires having a larger diameter (e.g., from about 8 nm to about 30 nm, or larger) have capacitance characteristics like a FET, where the capacitance goes around the nanowire. However, when the nanowire diameter is smaller (e.g., from about 2 nm to about 7 nm), there is a deviation from non-planar (e.g., FET) devices. See, for example, S. Bangsaruntip et al., "Gate-all-around Silicon Nanowire 25-Stage CMOS Ring Oscillators with Diameter Down to 3 nm," 2010 symposium on VLSI Technology (VLSIT), pgs. 21-22 (Aug. 23, 2010) (hereinafter "Bangsaruntip"), the entire contents of which are incorporated by reference herein. Bangsaruntip describes a PIN (p doped source, intrinsic channel, n doped drain) structure that would be electrically similar to the present nanowire capacitor device, but has a different physical structure. However, the present devices would function with the same characteristics. Specifically, FIG. 4a of Bangsaruntip illustrates capacitance measurements for nanowires with diameters ranging from 2.6 nm to 15.8 nm with gate-source voltage ($V_{GS}$) plotted on the x-axis and a ratio of gate capacitance ($C_G$) to gate length ($L_G$) (measured in femtofarads (fF) per micrometer (μm)) plotted on the y-axis.

Capacitance C can be calculated as follows:

$$\frac{C}{A} \propto \frac{1}{r\ln\left(1 + \frac{tox}{r}\right)},$$

wherein A is area, and r is radius. With smaller diameter nanowires (e.g., from about 2 nm to about 7 nm), C/A for the nanowires diverges from planar limit and shows dependency on nanowire size (diameter), as is expected for cylindrical capacitors. See, for example, FIG. 4b of Bangsaruntip which illustrates the planar limit for nanowire capacitance as a function of nanowire diameter wherein nanowire width ($W_E$) is plotted on the x-axis and C/A (measured in microfarads (μF) per square centimeter ($cm^2$)) is plotted on the y-axis. Parasitic capacitance in RO structure is approximately half of the total capacitance. Ideally, to counter variation in nanowire diameter, the size of the nanowires in the array is chosen so that the variation in capacitance with nanowire diameter is minimized.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An electronic device, comprising:
at least one first set of nanowires and first set of pads etched in an SOI layer of an SOI wafer and at least one second set of nanowires and second set of pads etched in the SOI layer, wherein the first set of pads are attached at opposite ends of the at least one first set of nanowires in a ladder-like configuration, wherein the second set of pads are attached at opposite ends of the at least one second set of nanowires in another ladder-like configuration, and wherein the at least one first set of nanowires and the first set of pads correspond to a capacitor device and the at least one second set of nanowires and the second set of pads correspond to a FET device, the capacitor device and the FET device both being present on the SOI wafer;
a first gate stack that surrounds at least a portion of each of the at least one first set of nanowires that serves as a channel region of the capacitor device, wherein portions of the at least one first set of nanowires extending out from the first gate stack and the first set of pads serve as source and drain regions of the capacitor device, wherein the source and drain regions of the capacitor device are undoped;
a second gate stack that surrounds at least a portion of each of the at least one second set of nanowires that serves as a channel region of the FET device, wherein portions of the at least one second set of nanowires extending out from the second gate stack and the second set of pads serve as source and drain regions of the FET device, wherein the source and drain regions of the FET device are doped;
first spacers on opposite sides of the first gate stack and second spacers on opposite sides of the second gate stack, wherein the first spacers have a width wa and the second spacers have a width wb, and wherein wa<wb;
a first silicide formed on the source and drain regions of the capacitor device; and
a second silicide formed on the source and drain regions of the FET device, wherein an amount of the first silicide formed on the source and drain regions of the capacitor device is greater than an amount of the second silicide formed on the source and drain regions of the FET device such that first silicide formed on the source and drain regions of the capacitor device extends at least to an edge of the first gate stack while the second silicide formed on the source and drain regions of the FET device remains within the source and drain regions of the FET device.

2. The electronic device of claim 1, wherein the channel region of the capacitor device is undoped, and wherein the first silicide extends at least to the edge of the first gate stack forming a Schottky junction between the first silicide and the channel region of the capacitor device which is undoped.

3. The electronic device of claim 1, wherein the channel region of the capacitor device is undoped, and wherein the first silicide extends beyond the edge of the first gate stack into the channel region of the capacitor device and thus the first silicide is present under the first gate stack.

4. The electronic device of claim 1, further comprising:
epitaxial silicon present only on the source and drain regions of the FET device.

5. An electronic device, comprising:
at least one first set of nanowires and first set of pads in a SOI layer of an SOI wafer and at least one second set of nanowires and second set of pads etched in the SOI layer, wherein the first set of pads are attached at opposite ends of the at least one first set of nanowires in a ladder-like configuration, wherein the second set of pads are attached at opposite ends of the at least one second set of nanowires in another ladder-like configuration, and wherein the at least one first set of nanowires and the first set of pads correspond to a capacitor device and the at least one second set of nanowires and the second set of pads correspond to a FET device, the capacitor device and the FET device both being present on the SOI wafer;
a first gate stack that surrounds at least a portion of each of the at least one first set of nanowires that serves as a channel region of the capacitor device, wherein portions of the at least one first set of nanowires extending out from the first gate stack and the first set of pads serve as source and drain regions of the capacitor device, wherein the source and drain regions of the capacitor device are doped;
a second gate stack that surrounds at least a portion of each of the at least one second set of nanowires that serves as a channel region of the FET device, wherein portions of the at least one second set of nanowires extending out from the second gate stack and the second set of pads serve as source and drain regions of the FET device, wherein the source and drain regions of the FET device are doped;
first spacers on opposite sides of the first gate stack and second spacers on opposite sides of the second gate stack, wherein the first spacers have a width wa and the second spacers have a width wb, and wherein wa<wb;
a first silicide on the source and drain regions of the capacitor device; and
a second silicide on the source and drain regions of the FET device,
wherein an amount of the first silicide formed on the source and drain regions of the capacitor device is greater than an amount of the second silicide formed on the source and drain regions of the FET device such that first silicide formed on the source and drain regions of the capacitor device extends into the channel region of the capacitor device which is undoped while the second silicide formed on the source and drain regions of the FET device remains within the source and drain regions of the FET device.

6. The electronic device of claim 2, wherein the first silicide extends beyond a junction between the source and drain regions of the capacitor device which are doped and the channel region of the capacitor device which is undoped forming a Schottky junction between the first silicide and the channel region of the capacitor device.

7. The electronic device of claim 2, further comprising:
epitaxial silicon present only on the source and drain regions of the FET device.

* * * * *